(12) United States Patent
Imamura et al.

(10) Patent No.: US 6,908,696 B2
(45) Date of Patent: Jun. 21, 2005

(54) ORGANIC ELECTRO LUMINESCENCE DISPLAY DEVICE

(75) Inventors: Yuko Imamura, Yokohama (JP); Kimito Sakai, Funabashi (JP); Akio Amano, Kawasaki (JP); Katsuyuki Naito, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/298,061

(22) Filed: Nov. 18, 2002

(65) Prior Publication Data

US 2003/0175552 A1 Sep. 18, 2003

(30) Foreign Application Priority Data

Mar. 18, 2002 (JP) ........................................ 2002-075019

(51) Int. Cl.[7] ................................................. B32B 9/00
(52) U.S. Cl. ..................... 428/690; 428/917; 313/502; 313/503; 313/506
(58) Field of Search ................................. 428/690, 917; 252/301.35; 313/504, 506, 502, 203; 430/7

(56) References Cited

U.S. PATENT DOCUMENTS

| 3,973,057 | A | * | 8/1976 | Channin et al. ............. 427/162 |
| 5,171,476 | A | * | 12/1992 | Bloodworth et al. .......... 516/55 |
| 5,883,042 | A | * | 3/1999 | Defieuw et al. ............. 503/201 |
| 6,140,016 | A | * | 10/2000 | Suzuki et al. ............. 430/281.1 |
| 6,232,024 | B1 | * | 5/2001 | Kimura et al. ................ 430/26 |
| 6,372,154 | B1 | * | 4/2002 | Li ......................... 252/301.16 |
| 6,464,898 | B1 | * | 10/2002 | Tomoike et al. ........ 252/301.35 |
| 6,627,364 | B2 | * | 9/2003 | Kiguchi et al. ................ 430/7 |
| 6,695,980 | B2 | * | 2/2004 | Irvin et al. ............. 252/301.16 |
| 2003/0025445 | A1 | * | 2/2003 | Lee ............................ 313/503 |

FOREIGN PATENT DOCUMENTS

| JP | 63-264692 | 11/1988 |
| JP | 63-295695 | 12/1988 |
| JP | 1-243393 | 9/1989 |
| JP | 1-245087 | 9/1989 |

* cited by examiner

Primary Examiner—Rena Dye
Assistant Examiner—Camie S Thompson
(74) Attorney, Agent, or Firm—Finnegan, Henderson, Farabow, Garrett & Dunner, L.L.P.

(57) ABSTRACT

An electro luminescence display device is provided, including a plurality of pixels arranged in a two dimensional direction, each pixel having a plurality of different kinds of organic electro luminescence elements differing from each other in the color of the emitted light, and each of the organic electro luminescence elements having an anode, a cathode, and a polymer light-emitting layer located between the anode and the cathode, wherein the polymer light-emitting layer emitting light of at least one color includes a nonionic surfactant having a fluorine-substituted alkyl group containing, e.g., an alkyl silyl group.

11 Claims, 1 Drawing Sheet

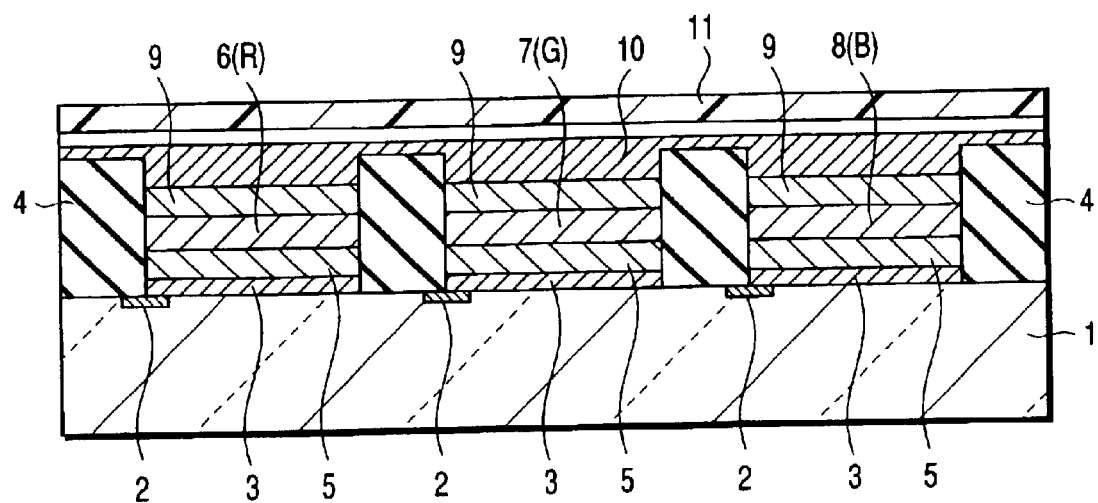
FIGURE

ORGANIC ELECTRO LUMINESCENCE DISPLAY DEVICE

CROSS-REFERENCE TO RELATED APPLICATIONS

This application is based upon and claims the benefit of priority from the prior Japanese Patent Application No. 2002-075019, filed Mar. 18, 2002, the entire contents of which are incorporated herein by reference.

BACKGROUND OF THE INVENTION

1. Field of the Invention

The present invention relates to an organic electro luminescence (organic EL) display device having a high brightness and a long life.

2. Description of the Related Art

Recently, an electro luminescence (EL) element using a multi-layered film of an organic material attracts attention as disclosed in, for example, Jpn. Pat. Appln. KOKAI Publication No. 63-264692, Jpn. Pat. Appln. KOKAI Publication No. 63-295695, Jpn. Pat. Appln. KOKAI Publication No. 1-243393 and Jpn. Pat. Appln. KOKAI Publication No. 1-245087. Organic EL elements can be roughly classified into elements manufactured by a vacuum vapor deposition of a low molecular weight material, and elements manufactured by a polymer solution coating. The method employing the polymer solution coating facilitates the manufacture of an organic EL element having a large area and is adapted for, particularly, the manufacture of a large-screen, high precision, full color display using by the ink jet process.

In polymer organic EL display devices, an organic thin film having a thickness of scores of nanometers is required in order to lower the voltage applied to the display device. In addition, if the polymer thin film is nonuniform in thickness and poor in flatness within an element or among different elements, the pixel life is greatly reduced. Therefore, the polymer film is required to be uniform in thickness. Also, if the wettability within the nozzle is changed during the formation of the polymer film by the ink jet method, the uniformity of the pixels within the screen is greatly reduced. Therefore, the polymer solution is required to exhibit a consistent wettability in the film-forming process.

However, conventional organic EL display devices were not satisfactory in the thickness uniformity and the flatness of the polymer thin film within the element and among different elements. As a result, it was difficult to suppress the change in wettability within the nozzle in the step of forming a polymer thin film by the conventional ink jet method.

BRIEF SUMMARY OF THE INVENTION

According to one aspect of the present invention, there is provided an organic electro luminescence display device, comprising:

a plurality of pixels arranged in a two dimensional direction, each pixel comprising a plurality of different kinds of organic electro luminescence elements differing from each other in the color of the emitted light, and each of the organic electro luminescence elements comprising an anode, a cathode, and a polymer light-emitting layer located between the anode and the cathode, wherein the polymer light-emitting layer emitting light of at least one color comprises a nonionic surfactant having a fluorine-substituted alkyl group.

BRIEF DESCRIPTION OF THE SEVERAL VIEWS OF THE DRAWING

The single FIGURE is a cross sectional view showing the construction of an organic EL display device according to one embodiment of the present invention.

DETAILED DESCRIPTION OF THE INVENTION

The single FIGURE is a cross sectional view schematically showing the construction of an organic EL display device according to one embodiment of the present invention. The organic EL display device according to one embodiment of the present invention will now be described with reference to the single FIGURE, although the organic EL display device of the present invention is not limited to the device shown in the single FIGURE.

As shown in the single FIGURE, a plurality of partition walls 4 each containing an insulating material are formed on the surface of an insulating transparent substrate 1 made of, for example, glass. An organic EL element emitting light of any of the three primary colors (R, G, B) is formed in the cell defined between adjacent partition walls 4. One pixel is formed by these three organic EL elements. To be more specific, three organic EL elements each formed of an anode 3 made of a transparent conductive oxide such as ITO (Indium-tin-oxide), a hole transfer layer 5, a polymer light-emitting layer 6(R), 7(G) or 8(B), an electron transfer layer 9, and a cathode 10 made of a reflective metal, which are formed in the order mentioned on the surface of the substrate 1, are separated from each other by the partition walls 4. The polymer light-emitting layer 6 contains a coloring material emitting red light (R). Also, the polymer light-emitting layer 7 contains a coloring material emitting green light (G), and the polymer light-emitting layer 8 contains a coloring material emitting blue light (B). What should be noted is that the polymer light-emitting layer emitting light of at least one of the three primary colors (R, G, B) contains a nonionic surfactant having a fluorine-substituted alkyl group. These organic EL elements are connected to transistors 2. Further, a sealing film 11 is formed to constitute the uppermost layer of each of these organic EL elements.

One pixel is formed by these three organic EL elements. If a voltage is applied between the anode and the cathode of a desired organic EL element by the transistor 2, light of a desired color is emitted from the polymer light-emitting layer 6, 7 or 8. To be more specific, holes supplied from the anode 3 are migrated through the hole transfer layer 5 so as to reach the polymer light-emitting layer 6, 7 or 8. On the other hand, electrons supplied from the cathode 10 are migrated through the electron transfer layer 9 so as to reach the polymer light-emitting layer 6, 7 or 8. It follows that the holes and the electrons combine within the polymer light-emitting layer so as to emit light. The emitted light can be observed through the transparent substrate 1. It is possible to manufacture an organic EL display device by arranging a large number of pixels each constituted as shown in the single FIGURE in a two dimensional direction.

In one embodiment of the present invention, the polymer light-emitting layer emitting light of at least one of the three primary colors contains a nonionic surfactant containing a fluorine-substituted alkyl group. By the substitution of fluorine, the hydrophobic nature of the fluorine-substituted alkyl group is increased so as to promote the surfactant function performed by the fluorine-substituted alkyl group. It is possible for the fluorine atom to be substituted for an optional hydrogen atom of the alkyl group. It is also possible for the fluorine atoms to be substituted for an optional number of hydrogen atoms including one hydrogen atom and all the carbon atoms of the alkyl group. Incidentally, if the number of fluorine atoms substituting the carbon atoms of the alkyl group is excessively low, the hydrophobic nature of the fluorine-substituted alkyl group is rendered excessively low, resulting in failure of the fluorine-substituted alkyl group to act as a sufficient surfactant. On the other hand, if the number of the substituting fluorine atoms is excessively large, it is difficult for the fluorine-substituted alkyl group to be dissolved in an ink.

Incidentally, any hydrogen atom bonded to the carbon atom of the nonionic surfactant may be substituted with a fluorine-substituted alkyl group.

The nonionic surfactant having a fluorine-substituted alkyl group, which is contained in the polymer light-emitting layer, is precipitated on the interface of the polymer light-emitting layer. As a result, light is uniformly emitted within the pixel so as to prolong the life of the element. Also, the nonionic surfactant having the fluorine-substituted alkyl group precipitated on the interface of the polymer light-emitting layer produces the effect of inhibiting the intrusion of ions or molecules from the other layers such as the hole injecting layer and the electrode so as to improve the life of the element and the light emitting efficiency. Further, since the hydrophobic nature is increased by the fluorine-substituted alkyl group, the water adsorption can be decreased. In addition, the nonionic surfactant does not function as a charge trap.

Concerning the manufacture of the organic EL display device according to one embodiment of the present invention, known is a method of forming a polymer light-emitting layer of each of the organic EL elements by the jet coating of an ink containing the polymer light-emitting material by using an ink jet apparatus. In one embodiment of the present invention, a nonionic surfactant having a fluorine-substituted alkyl group is added to an ink containing a polymer light-emitting material emitting light of at least one of the three primary colors.

To be more specific, the organic electro luminescence display device according to one embodiment of the present invention comprises a plurality of pixels arranged two dimensionally, each pixel comprising a plurality of different kinds of organic electro luminescence elements differing from each other in the color of the emitted light and each of said organic electro luminescence elements comprising an anode, a cathode, and a polymer light-emitting layer located between said anode and said cathode. This organic EL display device can be manufactured by a method, characterized in that the polymer light-emitting layer emitting light of at least one color and containing a nonionic surfactant having a fluorine-substituted alkyl group is formed by ink jet coating using an ink jet apparatus.

If a nonionic surfactant having a fluorine-substituted alkyl group is added to the ink containing a polymer light-emitting material, the nonionic surfactant having a fluorine-substituted alkyl group is precipitated on the interface of the ink so as to make it possible to form a uniform film of a high flatness within the pixel. Also, the ink to which is added a nonionic surfactant having a fluorine-substituted alkyl group permits improving the slippage of the ink within the ink jet nozzle. As a result, it is possible to obtain the effects that the nozzle is unlikely to be plugged so as to make it possible to form a uniform film from the beginning to the end of the film formation, and that the power consumption required for the ink jet coating is decreased so as to achieve energy saving.

Concerning the ink jet nozzle, it is possible for the fluid passageway leading from the fluid inlet port to the discharge port of the nozzle to have a constant width. Also, it is possible for the discharge port to have a smaller width because the pressure applied to the discharge port is not increased in the case of reducing the width of the discharge port. Further, it is possible to adjust the discharge amount from the ink jet nozzle within a range of between 3 picoliters and 500 picoliters depending on the size of the pixel and the ink characteristics. If the discharge amount is less than 3 picoliters, the possibility of a defective discharge is increased. On the other hand, if the discharge amount is larger than 500 picoliters, the possibility for the ink to droop is increased.

The nonionic surfactant includes, for example, a nitrogen-containing surfactant, an ester-based surfactant, an ester ether-based surfactant and an ether-based surfactant. An ether-based surfactant is most preferably used, because it produces a high surface activity even if the addition amount thereof is small. In addition, the ether chain acts as a metal ion trapping agent. It is desirable for the ether-based surfactant to be formed of aliphatic compounds such as polyoxyethylene alkyl ether, polyoxyethylene polyoxypropylene glycol, polyoxyethylene alkyl phenyl ether and polyoxyethylene polystyryl phenyl ether.

It is desirable for the molecular weight of the fluorine-substituted alkyl group, which is not particularly limited, to fall within a range of between 33 and 100,000, more preferably between 1,000 and 100,000. If the molecular weight is higher than 100,000, the nature as a polymer is increased and, thus, the viscosity is increased, making it difficult to prepare a uniform film. On the other hand, if the molecular weight is excessively low, it is possible that the fluorine-substituted alkyl group acts as a charge trap within the light emitting layer, which impairs the light emission.

It is desirable for the nonionic surfactant having a fluorine-substituted alkyl group to have a nonpolar group at the terminal. It is desirable for the nonpolar group to be a halogen-substituted or unsubstituted alkyl group having 1 to 50 carbon atoms, an alkyl silyl group having 1 to 50 carbon atoms, or an aryl group having 6 to 50 carbon atoms. Also, it is desirable for the nonionic surfactant to have such a nonpolar group at every terminal. It is desirable to use these nonpolar groups because these nonpolar groups are low in reactivity and, thus, do not impair the light emission. In the nonionic surfactant having a nonpolar group at the terminal, the depolymerization of the surfactant itself is prevented so as to increase the thermal stability. In addition, the terminal does not act as a trapping agent of holes or electrons. It follows that the life of the element and the light emitting efficiency can thus be improved. The specific nonpolar group is provided by an alkyl group represented by a general formula $C_nH_{2n-1}$ or a phenyl group, and it is desirable for a fluorine atom to be substituted in the nonpolar group. It is particularly desirable for the nonpolar group to be provided by an alkyl silyl group. The alkyl silyl group is stable against heat, exhibits high hydrophobicity and, thus, is unlikely to act as a charge trap. In addition, the alkyl silyl group can be easily introduced into the nonionic surfactant, and its reaction yield is very high.

What should also be noted is that, where the nonionic surfactant having a fluorine-substituted alkyl group has a nonpolar group at the terminal, the interaction between the surfactant and the ink jet nozzle is decreased and the slippage of the surfactant is improved, thereby being advantageous in the manufacturing process.

It is desirable for the polymer light-emitting layer (or the ink in the manufacturing process) to contain a nonionic surfactant having a fluorine-substituted alkyl group in an amount falling within a range of between 0.005 and 5% by weight, more preferably between 0.01 and 1% by weight. Where the content of the nonionic surfactant is lower than 0.005% by weight, it is impossible to obtain the effect produced by the surfactant. On the other hand, where the content of the nonionic surfactant is higher than 5% by weight, the surfactant is precipitated on the interface of the light emitting layer, which inhibits the migration of holes and electrons, with the result that light emission is further inhibited.

In the embodiment of the present invention, it is desirable for the polymer light-emitting layer to have a thickness falling within a range of between about 10 nm and 200 nm. If the thickness of the polymer light-emitting layer is greater than 200 nm, it is necessary to increase the driving voltage. It is also possible for the injected electrons or holes to be deactivated, which lowers the probability of recombination. It follows that the light emitting efficiency of the polymer light-emitting layer would then be lowered. On the other hand, if the thickness of the polymer light-emitting layer is smaller than 10 nm, it is difficult to form a uniform film, giving rise to the possibility that the EL elements differ in terms of light emitting performance.

The constituents of the organic EL display device according to one embodiment of the present invention will now be described in detail.

The substrate is not particularly limited. However, where the light emission is observed through the substrate, used is a transparent substrate such as glass.

A conductive material is used for forming any of the anode and the cathode. Particularly, a transparent conductive material such as ITO is used for forming the electrode arranged on the side of the light emitting surface.

A hole transfer layer is arranged as required between the anode and the polymer light-emitting layer and an electron transfer layer is arranged as required between the cathode and the polymer light-emitting layer. An n-type semiconductor material, which permits transferring the electrons supplied from the cathode into the polymer light-emitting layer without deactivating the electrons, is used for forming the electron transfer layer. On the other hand, a p-type semiconductor material, which permits transferring the holes supplied from the anode into the polymer light-emitting layer without deactivating the holes, is used for forming the hole transfer layer. It is desirable for the electron transfer layer or the hole transfer layer to have a thickness falling within a range of between about 10 nm and 200 nm. If the thickness of the electron transfer layer or the hole transfer layer is less than 10 nm, it is possible for the electron transfer layer or the hole transfer layer to fail to sufficiently perform the function described above. On the other hand, if the thickness of the electron transfer layer or the hole transfer layer is greater than 200 nm, it is possible for the electrons to be deactivated within the electron transfer layer and for the holes to be deactivated within the hole transfer layer, with the result that the light emitting efficiency of the light-emitting layer would be lowered.

Some Examples of the present invention will now be described.

EXAMPLE 1

Prepared was an organic EL display device sized at 2.5 inches square and comprising a large number of pixels each including three organic EL elements as shown in the single FIGURE and sized at 100 μm square. In this EL display, one pixel is formed by three organic EL elements. As described later, five kinds of organic EL display devices A to E were prepared by using any of nonionic surfactants "a" to "e" having five kinds of fluorine-substituted alkyl groups in forming the polymer light-emitting layers emitting a blue light.

To be more specific, an anode 3 was formed in a thickness of about 50 nm on a glass substrate 1 by using ITO (indium-tin-oxide), which is a transparent conductive material. Also, a partition wall 4 was formed in the form of a lattice by a photoresist process.

Then, a hole transfer layer 5 was formed in a thickness of 20 nm by a dipping method by using as a hole transfer material a PEDOT•PSS compound represented by chemical formula (1) given below:

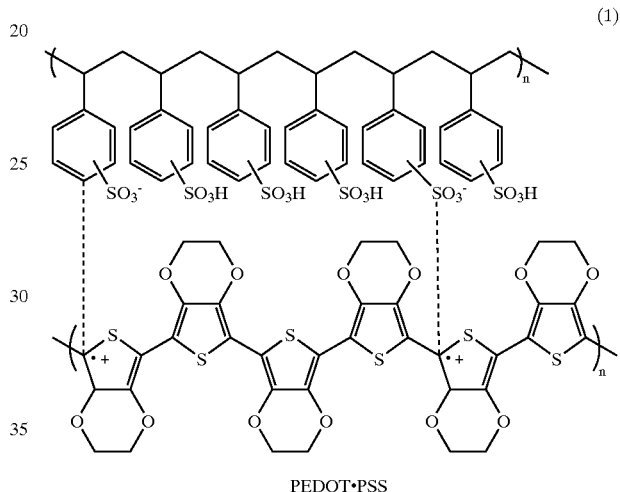

PEDOT•PSS (1)

Poly(3-alkyl thiophene) (PAT) represented by chemical formula (2) given below was used as the polymer light-emitting layer emitting a red light. Also, a host molecule represented by chemical formula (3) given below, which was doped with 0.5% by weight of a coloring material represented by chemical formula (4) given below, was used as the polymer light-emitting material emitting a green light. Further, poly(9,9'-dialkyl fluorene) (PDAF) represented by chemical formula (5) given below was used as the polymer light-emitting material emitting a blue light.

PAT(R)

(2)

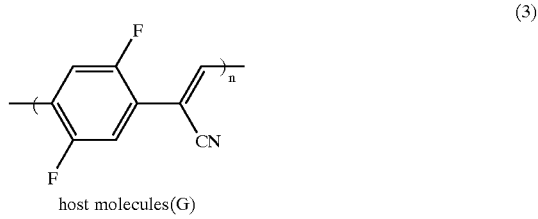

host molecules(G)

(3)

-continued

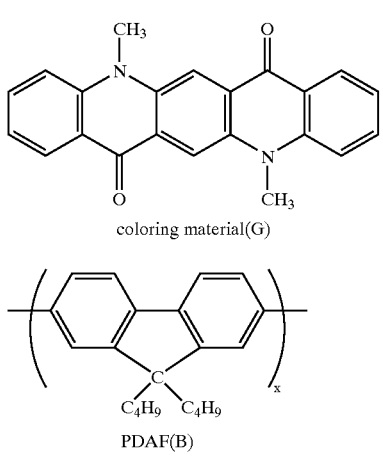

coloring material(G)

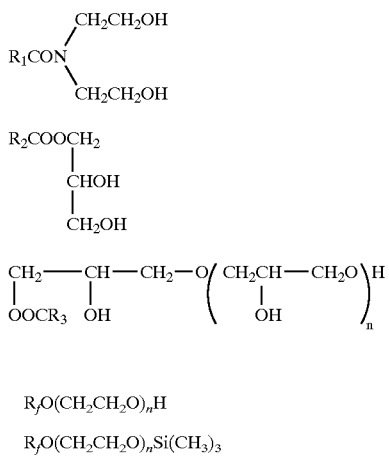

PDAF(B)

Nonionic surfactants (a) to (e) having fluorine-substituted alkyl groups represented by chemical formulas (a) to (e) given below were used as surfactants added to the polymer light-emitting material emitting a blue light:

a: Aminone S-02 (trade name of a nitrogen-containing surfactant (fatty acid diethanol amide) manufactured by Kao K.K.)

b: TG-C (trade name of an ester-based surfactant (partial ester of glycerin fatty acid) manufactured by Sanyo Kasei K.K.)

c: Emulex GM (trade name of an ester ether-based surfactant (partial ester of polyglycerin fatty acid) manufactured by Nippon Emulsion K.K.)

d: FTX-22 (trade name of an ether-based surfactant (diglycerin tetrakis (RfO-polyoxyethylene ether) manufactured by Neos Inc.)

e: Surfactant "e" was prepared by introducing a nonpolar group into the terminal by sililating the terminal hydroxyl group of ether-based surfactant "d" given above.

(a) $R_1CON\begin{smallmatrix}CH_2CH_2OH\\CH_2CH_2OH\end{smallmatrix}$ (b) $R_2COOCH_2$ — $CHOH$ — $CH_2OH$ (c) $CH_2$—$CH$—$CH_2$—$O(CH_2CH$—$CH_2O)_nH$
    $|$      $|$               $|$
    $OOCR_3$ $OH$              $OH$ (d) $R_fO(CH_2CH_2O)_nH$ (e) $R_fO(CH_2CH_2O)_nSi(CH_3)_3$ In the chemical formulas given above, each of $R_1$ and $R_2$, which may be the same or different, represents an alkyl group, $R_f$ represents a fluorine-substituted alkyl group, and "n" is an integer falling within a range of between 1 and 50.

The polymer light-emitting material emitting a red light was dissolved in an organic solvent, and the resultant solution was used for the printing using an ink jet printer so as to form a polymer light-emitting layer 6(R). Likewise, the polymer light-emitting material emitting a green light was dissolved in an organic solvent, and the resultant solution was used for the printing using an ink jet printer so as to form a polymer light-emitting layer 7(G). Further, the polymer light-emitting material emitting a blue light was dissolved in an organic solvent, and any of nonionic surfactants "a" to "e" each having a fluorine-substituted alkyl group was added to the resultant solution in an amount of 0.01% by weight. The solution thus prepared was used for the printing using an ink jet printer so as to form a polymer light-emitting layer 8(B). Any of the polymer light-emitting layers was formed in a thickness of 80 nm.

Then, an electron transfer layer 9 was formed, followed by forming on the electron transfer layer 9 a cathode 10 comprising a calcium layer having a thickness of 100 nm and a silver layer having a thickness of 300 nm and laminated on the calcium layer. Further, a sealing film 11 was formed on the uppermost surface so as to seal each of the pixels.

In this fashion, prepared were five kinds of organic EL display devices A to E differing from each other depending on the kind fluorine-substituted alkyl group nonionic surfactant used, of "a" to "e".

On the other hand, an additional organic EL display device F was also prepared similarly, except that a nonionic surfactant having a fluorine-substituted alkyl group was not added to the material used for forming the polymer light-emitting layer.

The blue light-emitting cell of each of the organic EL display devices A to F thus prepared was driven under a current density of 20 $mA/cm^2$ so as to measure the initial brightness and the half-life of the brightness, and evaluation of the nonuniformity of the light emission were conducted using a fluorescence microscope. The nonuniformity of the light emission is expressed in 5 stages. The ratio of the difference between the maximum value and the minimum value of the fluorescence intensity to the maximum intensity was used, in which a range not lager than 20% was evaluated as stage 5, the ratio larger than 20% and not larger than 40% was evaluated as stage 4, the ratio larger than 40% and not larger than 60% was evaluated as stage 3, the ratio larger than 60% and not larger than 80% was evaluated as stage 2, and the ratio larger than 80% was evaluated as stage 1. Table 1 shows the results of the evaluation.

TABLE 1

| Display device (color of emitted light: blue) | Added substance | Initial brightness [$cd/m^2$] | Half-life of brightness [hours] | Evaluation of nonuniform light emission by flourescence microscope |
|---|---|---|---|---|
| A | surfactant "a" | 600 | 10000 | 3 |
| B | surfactant "b" | 600 | 11000 | 3 |
| C | surfactant "c" | 600 | 11000 | 3 |
| D | surfactant "d" | 650 | 13000 | 4 |
| E | surfactant "e" | 700 | 15000 | 5 |
| F | none | 300 | 7000 | 2 |

As apparent from Table 1, it has been confirmed that the display device F, to which a surfactant was not added, was inferior to all of the display devices A to E, to which a surfactant was added, in all of the initial brightness, the half-life of the brightness, and the evaluation of the nonuniform light emission by fluorescence microscope. It has also been confirmed that the display devices D and E each using an ether-based nonionic surfactant having a fluorine-substituted alkyl group were superior in the exhibited characteristics to the display devices A to C using a nitrogen-containing nonionic surfactant, an ester-based nonionic surfactant or an ester ether-based nonionic surfactant each having a fluorine-substituted alkyl group. Further, it has been confirmed that the display device E using a surfactant having a nonpolar group introduced to the terminal exhibited prominent effects.

Incidentally, in Example 1, a nonionic surfactant having a fluorine-substituted alkyl group was added to the material used for forming the polymer light-emitting layer emitting a blue light. However, it is also possible to add the nonionic surfactant noted above to the other polymer light-emitting layer emitting light of another color. Further, it is possible to add the particular nonionic surfactant to only the polymer light-emitting layer emitting light of the other color.

EXAMPLE 2

An anode was formed by using ITO on a glass substrate as in Example 1, followed by forming a hole transfer layer on the anode by using a PEDOT•PSS compound. Then, PAT used in Example 1, which is the polymer light-emitting material emitting a red light, was dissolved in an organic solvent so as to prepare an ink. Further, 10 mL of the ink thus prepared was dispensed into each of containers 1 to 5 for an ink jet printer, followed by adding any of the surfactants "a" to "e" used in Example 1 to the dispensed ink in an amount of 0.01% by weight. Still further, a PAT film used as a polymer light-emitting layer was formed consecutively on the hole transfer layer by the ink jet printing method by using the ink having the surfactant added thereto.

On the other hand, 10 mL of an ink prepared by dissolving PAT in an organic solvent was dispensed into a container 6 for an ink jet printer, and a PAT film used as a polymer light-emitting layer was consecutively formed on the hole transfer layer by the ink jet printing method without adding a surfactant to the dispensed ink.

The state of the PAT film thus formed and the plugging of the ink jet printer nozzle in the printing step were examined, with the results as shown in Table 2.

TABLE 2

| Container No. | Added substance | State of PAT film | State of nozzle plugging |
| --- | --- | --- | --- |
| 1 | surfactant "a" | uniform film formation from beginning to end | none |
| 2 | surfactant "b" | uniform film formation from beginning to end | none |
| 3 | surfactant "c" | uniform film formation from beginning to end | none |
| 4 | surfactant "d" | uniform film formation from beginning to end | none |
| 5 | surfactant "e" | uniform film formation from beginning to end | none |
| 6 | none | film area was rendered nonuniform from the time of 2.5 mL dot omission was generated from the time of 6 mL | Polymer PAT was attached in the form of gel to the inner surface of nozzle at the completion of film formation |

As apparent from Table 2, it has been confirmed that, in the printing by an ink jet printer using an ink to which is added a nonionic surfactant having a fluorine-substituted alkyl group, it is possible to form a uniform film from the beginning to the end of the film formation, and to suppress or prevent the plugging of the nozzle of the ink jet printer.

From Examples 1 and 2, it has also been confirmed that an ink using an ether-based nonionic surfactant having a fluorine-substituted alkyl group is more desirable than an ink using a nitrogen-containing nonionic surfactant, an ester-based nonionic surfactant, or an ester ether-based nonionic surfactant each having a fluorine-substituted alkyl group, and that an ink using a nonionic surfactant having a nonpolar group introduced to the terminal produces a prominent effect.

As described above in detail, the present invention provides a polymer organic EL display device having a long life, free from the nonuniformity of the pixels, and capable of achieving a large area easily.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic electro luminescence display device, comprising:
    a plurality of pixels arranged in a two dimensional direction, each pixel comprising a plurality of different kinds of organic electro luminescence elements differing from each other in the color of the emitted light, and each of said organic electro luminescence elements comprising an anode, a cathode, and a polymer light-emitting layer located between said anode and said cathode,
    wherein said polymer light-emitting layer emitting light of at least one color comprises a nonionic surfactant having a fluorine-substituted alkyl group and a nonpolar group at the terminal, the nonpolar group being a fluorine-substituted alkyl silyl group having 1 to 50 carbon atoms.

2. The organic electro luminescence display device according to claim 1, wherein said fluorine-substituted alkyl group has a molecular weight falling within a range of between 33 and 100,000.

3. The organic electro luminescence display device according to claim 2, wherein said fluorine-substituted alkyl group has a molecular weight falling within a range of between 1,000 and 10,000.

4. The organic electro luminescence display device according to claim 1, wherein said nonpolar group is present in every terminal of said nonionic surfactant.

5. The organic electro luminescence display device according to claim 1, wherein said polymer light-emitting layer contains said nonionic surfactant in an amount falling within a range of between 0.005 and 5% by weight.

6. The organic electro luminescence display device according to claim 5, wherein said polymer light-emitting layer contains said nonionic surfactant in an amount falling within a range of between 0.01 and 1% by weight.

7. The organic electro luminescence display device according to claim 1, wherein said polymer light-emitting layer has a thickness falling within a range of between 10 nm and 200 nm.

8. An organic electro luminescence display device, comprising:
    a plurality of pixels arranged in a two dimensional direction, each pixel comprising a plurality of different kinds of organic electro luminescence elements differing from each other in the color of the emitted light, and each of said organic electro luminescence elements comprising an anode, a cathode, and a polymer light-emitting layer located between said anode and said cathode, wherein said polymer light-emitting layer emitting light of at least one color comprises a nonionic surfactant represented by general formula (e) given below:

$$R_fO(CH_2CH_2O)_nSi(CH_3)_3 \qquad (e)$$

where $R_f$ represents a fluorine-substituted alkyl group, and "n" is an integer of 1 to 50.

9. The organic electro luminescence display device according to claim 8, wherein said polymer light-emitting layer contains said nonionic surfactant in an amount falling within a range of between 0.005 and 5% by weight.

10. The organic electro luminescence display device according to claim 9, wherein said polymer light-emitting layer contains said nonionic surfactant in an amount falling within a range of between 0.01 and 1% by weight.

11. The organic electro luminescence display device according to claim 8, wherein said polymer light-emitting layer has a thickness falling within a range of between 10 nm and 200 nm.

* * * * *